United States Patent
Ho et al.

(10) Patent No.: US 9,032,262 B2
(45) Date of Patent: May 12, 2015

(54) MEMORY TEST METHOD, MEMORY TEST DEVICE, AND ADAPTER THEREOF

(71) Applicant: Wistron Corporation, New Taipei (TW)

(72) Inventors: Ding-Shiuan Ho, New Taipei (TW); Fu-Nen Lo, New Taipei (TW)

(73) Assignee: Wistron Corporation, New Taipei (TW)

( * ) Notice: Subject to any disclaimer, the term of this patent is extended or adjusted under 35 U.S.C. 154(b) by 105 days.

(21) Appl. No.: 13/911,629

(22) Filed: Jun. 6, 2013

(65) Prior Publication Data

US 2014/0053032 A1 Feb. 20, 2014

(30) Foreign Application Priority Data

Aug. 15, 2012 (TW) .............................. 101129571 A

(51) Int. Cl.
*G11C 29/00* (2006.01)
*G11C 29/08* (2006.01)
*G11C 29/56* (2006.01)
*G11C 5/04* (2006.01)

(52) U.S. Cl.
CPC ..... *G11C 29/08* (2013.01); *G11C 5/04* (2013.01); *G11C 29/56016* (2013.01)

(58) Field of Classification Search
CPC ....................................................... G11C 29/56
USPC ............................. 714/718, 764, 724, 743, 42
See application file for complete search history.

(56) References Cited

U.S. PATENT DOCUMENTS

| | | | | |
|---|---|---|---|---|
| 6,351,827 | B1 * | 2/2002 | Co et al. .......................... | 714/42 |
| 6,985,819 | B2 * | 1/2006 | Lipscomb et al. ............... | 702/57 |
| 7,165,002 | B2 * | 1/2007 | Adler ............................ | 702/117 |
| 7,272,774 | B2 * | 9/2007 | Co et al. ......................... | 714/764 |
| 7,478,290 | B2 * | 1/2009 | Co et al. ........................ | 714/718 |
| 7,529,864 | B2 * | 5/2009 | Kapoor et al. .................. | 710/22 |

* cited by examiner

*Primary Examiner* — Fritz Alphonse
(74) *Attorney, Agent, or Firm* — Muncy, Geissler, Olds & Lowe, P.C.

(57) ABSTRACT

A memory test device used to test performance of at least one memory module on an electronic device, are provided. The memory test device includes at least one adapter and a control unit. The adapter includes a plugging portion, a slot, and a switch circuit. The plugging portion is used to be plugged in a memory module slot of the electronic device. The slot is connected electrically to the plugging portion, is used for the memory module to plug in, and is capable of outputting a work voltage to the memory module when the adapter is plugged in the memory module slot and connected electrically to it. The switch circuit is connected electrically to the plugging portion and the slot. The control unit is connected electrically to the switch circuit of each adapter, where the control unit enables or disables the plugged memory module by controlling the switch circuit.

19 Claims, 4 Drawing Sheets

MEMORY TEST METHOD, MEMORY TEST DEVICE, AND ADAPTER THEREOF

CROSS-REFERENCES TO RELATED APPLICATIONS

This non-provisional application claims priority under 35 U.S.C. §119(a) on Patent Application No. 101129571 filed in Taiwan, R.O.C. on Aug. 15, 2012, the entire contents of which are hereby incorporated by reference.

BACKGROUND OF THE INVENTION

1. Technical Field

The present invention relates to a memory test method, a memory test device, and an adapter thereof.

2. Related Art

A memory is an important key part in either a desktop computer or a notebook computer. Running stability of the memory directly affects the stability during running of an operating system, so a memory provider must generally execute a series of complex electrical tests before delivery.

Additionally, the desktop computer or notebook computer assembly plant must perform a compatibility test for electronic parts in different memory configurations beforehand, so as to know beforehand whether a crash or other program errors occur when a computer host runs in different memory configurations, so as to reduce customer complaints which may occur consequently.

When the different memory configurations (for example, configurations in which two, four or eight memories are mounted), are conventionally tested, personnel are often required to insert and remove the memory from a change memory architecture, which is time-consuming and labor-consuming and probably shortens the service life of the memory.

Therefore, the conventional memory test device has the problem of being time-consuming and labor-consuming and probably shortening the service life of the memory.

SUMMARY

In view of this, the present invention provides a memory module test device, used to test running performance of at least one memory module on an electronic device to be tested, where the electronic device to be tested includes a circuit board, at least one memory module slot is disposed on the circuit board, and each memory module slot is used for the memory module to plug in, the memory test device includes at least one adapter and a control unit. The adapter includes a plugging portion, a slot, and a switch circuit. The plugging portion is used to be plugged in the memory module slot. The slot is connected electrically to the plugging portion, is used for the memory module to plug in, and is capable of outputting a work voltage to the memory module when the adapter is plugged in the memory module slot and connected electrically to the memory module slot. The switch circuit is connected electrically to the plugging portion and the slot. The control unit is connected electrically to the switch circuit of the adapter, where the control unit enables or disables the plugged memory module by controlling the switch circuit.

The present invention also provides an adapter, used to adapt a memory module to a memory slot of an electronic device to be tested, where the adapter includes a plugging portion, a slot, and a switch circuit. The plugging portion is used to be plugged in the memory module slot. The slot is connected electrically to the plugging portion, is used for the memory module to plug in, and is capable of outputting a work voltage to the memory module when the adapter is plugged in the memory module slot and connected electrically to the memory module slot. The switch unit is connected electrically to the plugging portion and the slot, and receives a first control signal to enable and disable the plugged memory module.

When the work voltage output by the slot is zero or is lower than a voltage required by the memory to normally run, the memory plugged in the slot is in a disabled state. When the work voltage output by the slot falls within a voltage range required by the memory to normally run, the memory plugged in the slot is in an enabled state. Through the previously described control of work voltage output, switchover can be performed between various memory configurations.

In sum, in the present invention switchover between various memory configurations can be performed through the adapter, the memory test item is executed, and the switchover between different memory configurations is performed without requiring a manual insertion and pulling manner, where the manner is required in the prior art.

BRIEF DESCRIPTION OF THE DRAWINGS

The disclosure will become more fully understood from the detailed description given herein below for illustration only, and thus not limitative of the present invention, wherein.

DETAILED DESCRIPTION

Figure 1:
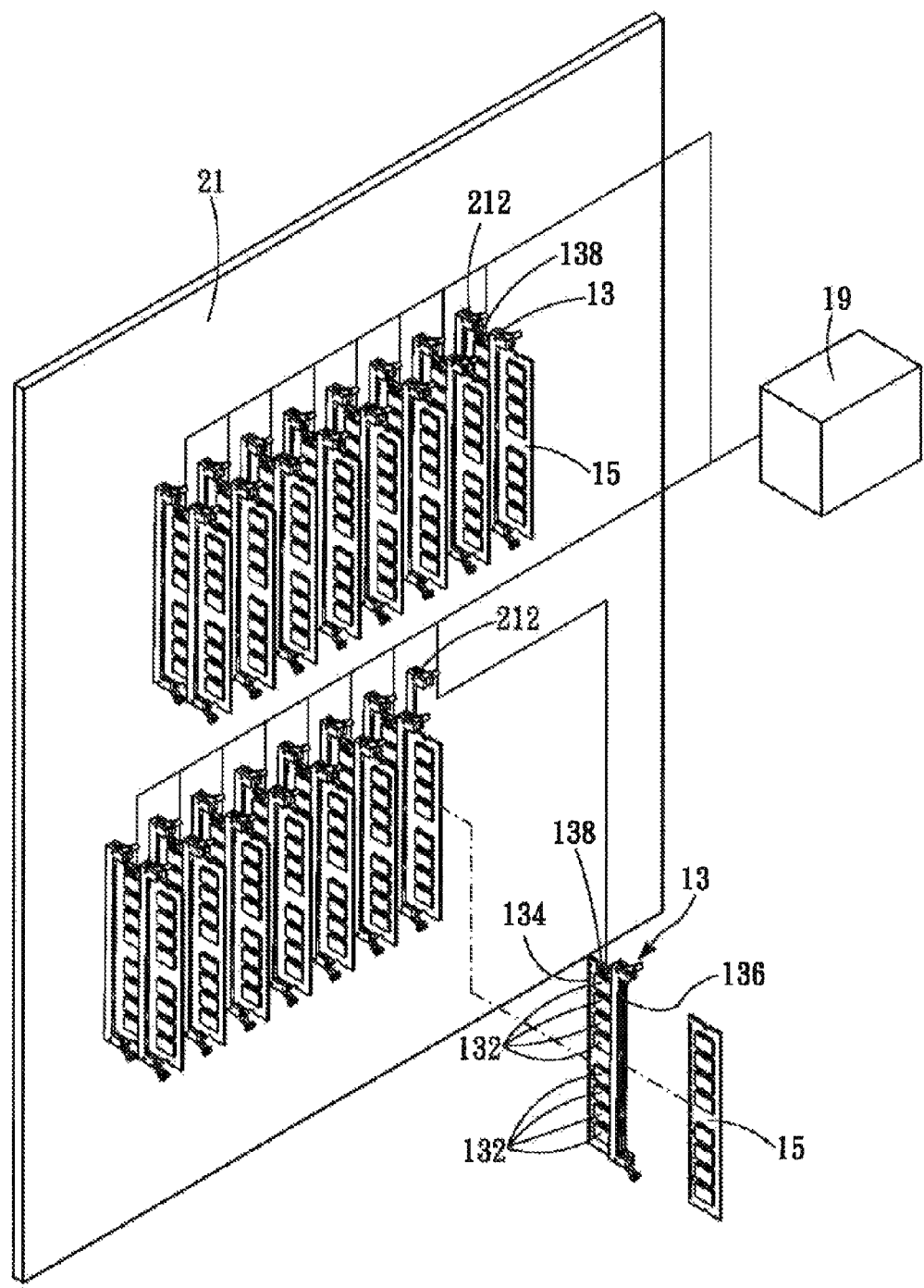
FIG. 1 is a first schematic view of a specific embodiment of the present invention.
Figure 2:
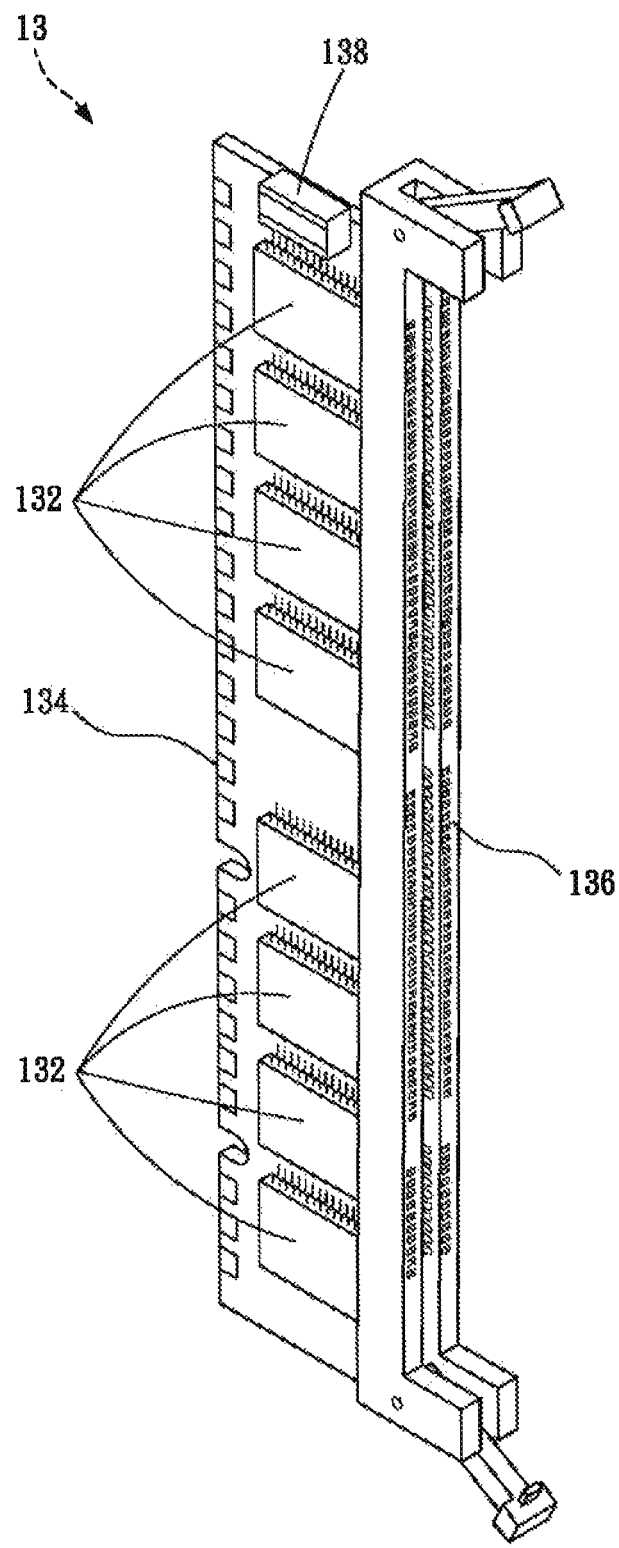
FIG. 2 is a second schematic view of a specific embodiment of the present invention.
Figure 3:
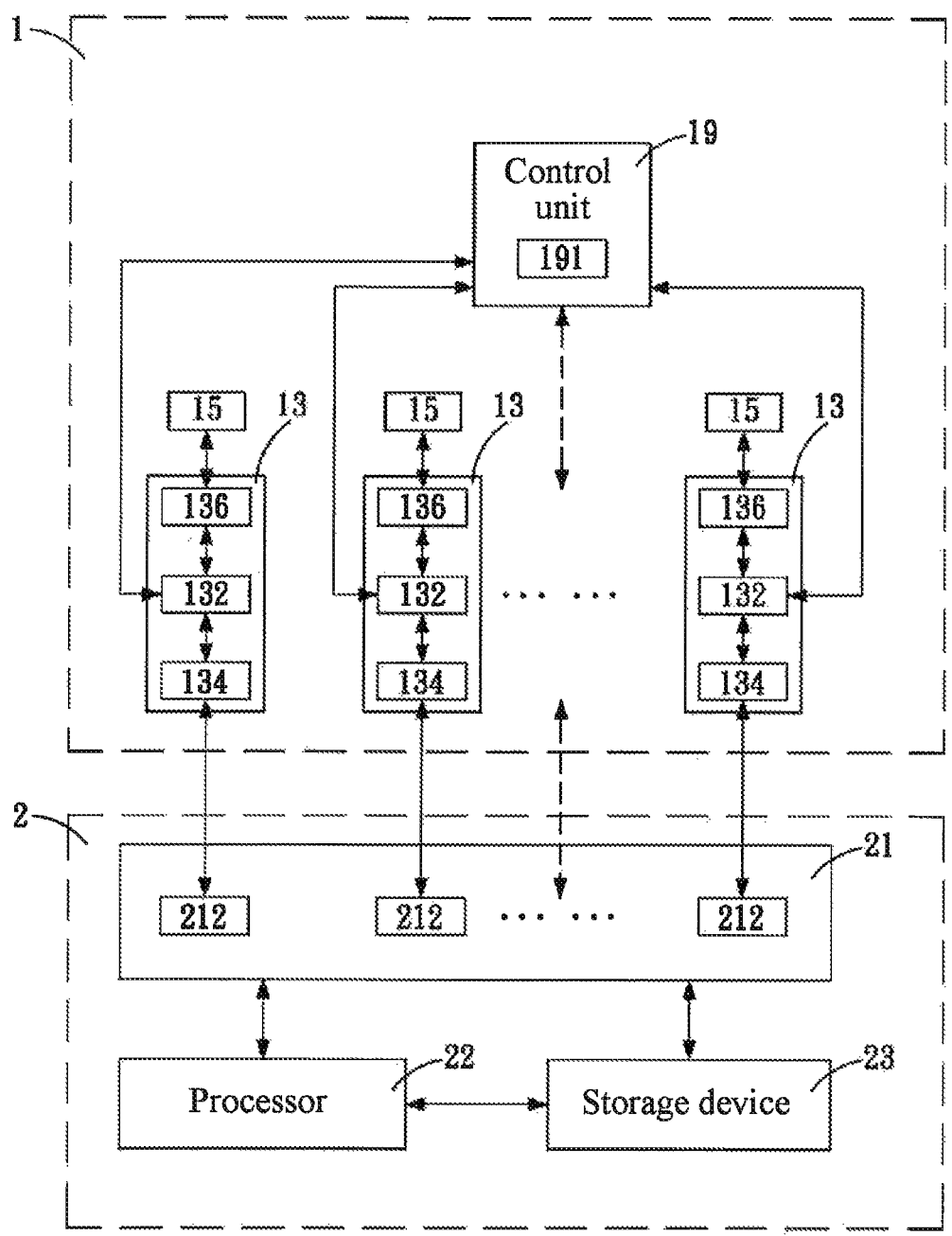
FIG. 3 is a diagram of a hardware architecture module of a specific embodiment of the present invention.

FIG. 1 is a first schematic view of a specific embodiment of the present invention. FIG. 2 is a second schematic view of a specific embodiment of the present invention. FIG. 3 is a diagram of a hardware architecture module. Please refer to FIG. 1 to FIG. 3, in which is disclosed a memory module test device, for testing running performance of a plurality of memory modules 15 on an electronic device 2 to be tested. The electronic device 2 to be tested may be, for example, an electronic apparatus such as a desktop computer, a server, or a notebook computer, and basically at least includes a circuit board 21, a processor 22, and a storage device 23. A plurality of memory module slots 212 is disposed on the circuit board 21 and is each used for a memory module 15 to plug in. The storage device 23 is installed with a memory test program, and the processor 22 is responsible for executing and controlling running of a memory and the memory test program. The memory test program may execute at least one memory test item on the memory module 15, where the memory test item is selected from a memory bandwidth, a memory and cache performance test, a memory read/write/copy speed, a single memory test, and the like.

As shown in FIG. 3, a memory test device 1 of the present invention includes a plurality of adapters 13 and a control unit 19.

Each adapter 13 includes a plugging portion 134, a slot 136, and a switch circuit 132. The plugging portion 134 is used to be plugged in the memory module slot 212 of the electronic device 2 to be tested. The slot 136 is connected electrically to the plugging portion 134, is used for the memory module 15 to plug in, and outputs a work voltage to the plugged memory module 15 when the adapter 13 is plugged in the memory module 15 and is connected electrically to the memory module 15. The switch circuit 132 is connected electrically to the plugging portion 134 and the slot 136.

The control unit 19 is connected electrically to the switch circuit 132 of each adapter 13. The control unit 19 is used to control the switch circuit 132 in a programmable manner through an operation interface 191 (such as a slide switch, a jumper, a key, a keyboard, or a graphical user interface (GUI)), so as to decide work voltage output of each slot 136. When the work voltage output by the slot 136 is zero or is lower than a voltage required by the memory module 15 to normally run, the memory module 15 plugged in the slot 136 is in a disabled state. When the work voltage output by the slot 136 falls within a voltage range required by the memory module 15 to normally run, the memory module 15 plugged in the slot 136 is in an enabled state.

Therefore, a test operator may set a test operation procedure of the control unit 19 through the operation interface 191, so that the programmable control unit 19 can control work voltage output of the switch circuit 132 of each adapter 13, and control the number and/or an order of tested memory modules of all the memory modules 15 connected electrically onto the electronic device 2 to be tested, so as to change a configuration state of the memory. With this embodiment, when the memory module is tested, the configuration state of the memory is changed without requiring a manual and selective insertion and pulling manner.

In an implementation aspect, the control unit 19 may further control enabling or disabling of each bit of each memory module 15 by manipulating the switch circuit 132.

In an implementation aspect, the control unit 19 may be a tailor-made and independent control device and include the operation interface 191 including a slide switch, a jumper, a key, a keyboard, a GUI, or the like. In another implementation aspect, the control unit 19 may be a dedicated test computer.

In an implementation aspect, the switch circuit 132 is a transistor (for example, an MOSFET) or a relay.

In an implementation aspect, as shown in FIG. 2, each adapter 13 further includes a connection port 138. The connection port 138 is connected electrically to the switch circuit 132, so that the control unit 19 is connected electrically to the switch circuit 132 through a transmission line via the connection port 138.

In an implementation aspect of executing a memory module test, when all memory module test items in a memory configuration (for example, only four memory modules 15 are in an enabled state) are performed completely, the control unit 19 outputs a reset signal to the electronic device 2, to be tested, to restart the electronic device 2 to be tested. Then, the control unit 19 controls enabling/disabling of each memory module 15 through the switch circuit 132 of the adapter 13, so as to form another memory configuration (for example, only eight memories are in an enabled state). Then, a memory test is performed for the electronic device 2 to be tested in a new memory configuration state. Repeating this sequence can automatically complete each memory test item in various memory configurations.

Please refer to FIG. 1 to FIG. 3, in which the present invention also provides an adapter, used to adapt a memory module 15 to a memory module slot 212 of an electronic device 2 to be tested. The adapter 13 includes a plugging portion 134, a slot 136, and a switch circuit 132. The plugging portion 134 is used to be plugged in the memory module slot 212 of the electronic device 2 to be tested. The slot 136 is connected electrically to the plugging portion 134, is used for the memory module 15 to plug in, and may output a work voltage to the memory module 15. The switch circuit 132 is connected electrically to the plugging portion 134 and the slot 136. The switch circuit 132 receives a first control signal to decide work voltage output of the slot 136.

In an implementation aspect, the adapter 13 further includes a connection port 138, connected electrically to the switch circuit 132. The switch circuit 132 receives the first control signal through the connection port 138.

In an implementation aspect, the switch circuit 132 further receives a second control signal to decide enabling or disabling of each bit of the memory.

In an implementation aspect, the first control signal and the second control signal are output by the control unit 19. The control unit 19 is connected electrically to the electronic device 2 to be tested and the switch circuit 132. The switch circuit 132 receives the control signal to decide work voltage output of the slot 136. When the work voltage output by the slot 136 is zero or is lower than a voltage required by the memory module 15 to normally run, the memory plugged in the slot 136 is in a disabled state. When the work voltage output by the slot 136 falls within a voltage range required by the memory module 15 to normally run, the memory plugged in the slot 136 is in an enabled state.

In an implementation aspect, the switch circuit 132 is a transistor (for example, an MOSFET), or a relay.

In sum, through the description of the foregoing specific embodiment, when the memory module tests in different memory configurations are intended to be performed, the memory configuration is changed without requiring a manual insertion and pulling manner, where the manner is required in the prior art; instead, the memory configuration is changed by the adapter 13 controlling enabling and disabling of each memory module 15. Additionally, when all memory module test items in a memory configuration are performed completely, the control unit 19 automatically outputs a reset signal to the electronic device 2 to be tested, to restart the electronic device 2 to be tested and perform a memory test for a next memory configuration. Repeating this sequence can automatically complete each memory module test item in various memory configurations.

Figure 4:
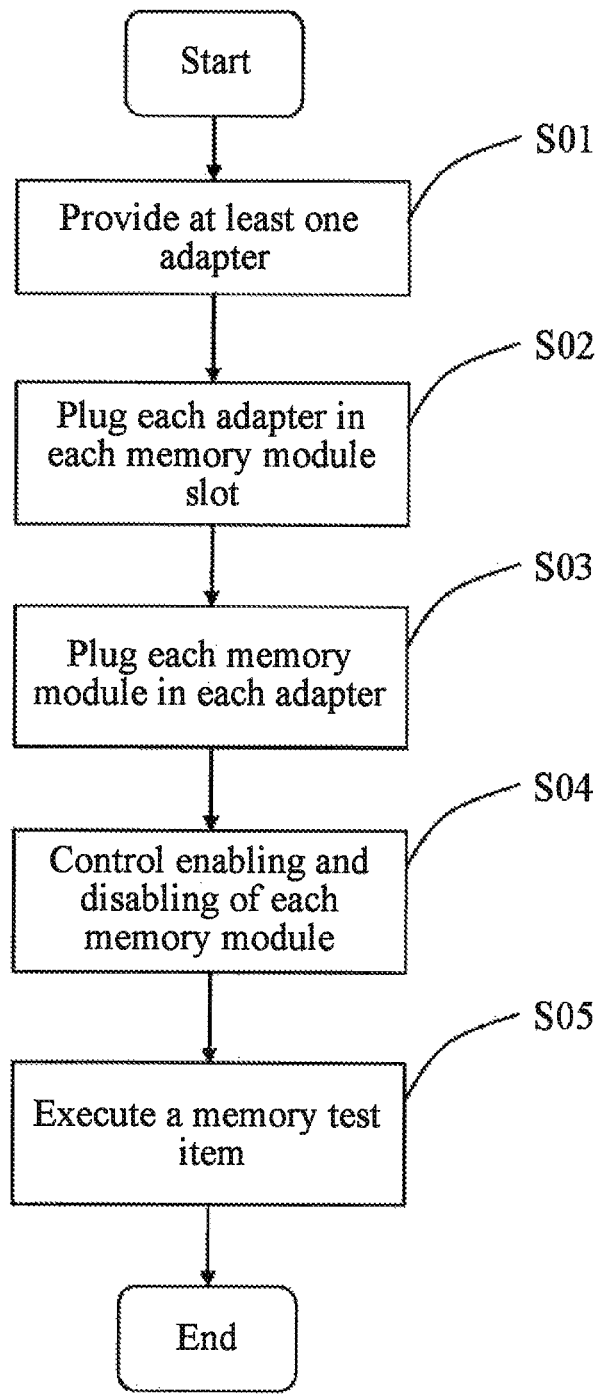
FIG. 4 is a flow chart of a memory module test method of the present invention.

FIG. 4 is a flow chart of a memory test method provided by the present invention applying the foregoing embodiment of the memory test device 1. Please refer to FIG. 4, in which the method is used to test running performance of at least one memory module on an electronic device to be tested. The electronic device to be tested includes a circuit board. At least one memory module slot is disposed on the circuit board. Each memory module slot is used for the memory module to plug in. The test method includes the following steps.

Step S01: Provide at least one adapter controlled by a control unit.

The adapter provided in this step is used to be plugged in the memory module slot of the electronic device to be tested and is used for each memory module to plug in.

Step S02: Plug each adapter in each memory module slot.

In this step, each adapter is plugged in each memory module slot of the electronic device to be tested.

Step S03: Plug each memory module in each adapter.

In this step, each memory module to be tested is plugged in each adapter.

Step S04: Control enabling and disabling of each memory module.

In this step, the control unit controls, through each adapter, enabling and disabling of the memory module plugged on the control unit.

Step S05: Execute a memory test item.

In this step, at least one memory test item is executed on each memory module in an enabling state. The enabling and the disabling of the memory module define a memory configuration state. For example, if the number of memory modules plugged in the electronic device to be tested is eight, and through step S04, four memory modules are in the enabling state, in this step, the memory test item is performed on the four memory modules in the enabling state. After the configuration state in which four memories are enabled is tested completely, step S04 may be repeated to change the memory configuration state. For example, all of the eight memory modules are in the enabling state, and the memory test item is performed in this memory configuration state until all possible memory configuration states are tested completely.

Additionally, the so-called memory configuration state can be changed in terms of either the number or the order. For example, in the same case that four memory modules 15 are in the enabling state, the first, the third, the fifth, and the seventh memory modules 15 may be controlled to be in the enabling state, or the first, the second, the third, and the fourth memory modules 15 may be controlled to be in the enabling state, or the first, the second, the seventh, and the eighth memory modules 15 may be controlled to be in the enabling state, which can be controlled according the requirement of the test operator.

In an implementation aspect, after executing each memory test item completely, the memory test method further includes a step, that is, sending a reset signal to the electronic device to be tested to restart the electronic device to be tested. That is because that when a memory configuration of some electronic devices to be tested is changed, a procedure of restarting and loading an operating system must be performed. After the electronic device to be tested is reset, each adapter controls enabling and disabling of the memory module to define another memory configuration state, and in this memory configuration state, each memory test item is executed on each memory module in the enabling state.

In an implementation aspect, the adapter includes a plugging portion 134, a slot 136, and a switch circuit 132, as shown in FIG. 1 to FIG. 3. The plugging portion 134 is used to be plugged in the memory module slot 212 of the electronic device 2 to be tested. The slot 136 is connected electrically to the plugging portion 134, is used for the memory module 15 to plug in, and may output a work voltage to the memory module 15. The switch circuit 132 is connected electrically to the plugging portion 134 and the slot 136. The switch circuit 132 receives a first control signal to decide work voltage output of the slot 136. Therefore, in this method, the adapter 13 receives a first control signal to control enabling and disabling of each memory module 15; Additionally, in this method, the adapter 13 further receives a second control signal to control enabling and disabling of each bit of each memory module 15.

In sum, through the foregoing memory test method, when the memory module tests in different memory configurations are intended to be performed, the memory configuration is changed without requiring a manual insertion and pulling manner, where the manner is required in the prior art; instead, the memory configuration is changed by the adapter 13 controlling enabling and disabling of each memory module. Additionally, when all memory test items in a memory configuration are performed completely, each memory test item is automatically executed for a next memory configuration state. If the memory configuration can be changed only after the electronic device to be tested is reset, in this method, all memory test items in a memory configuration are performed completely, a reset signal is automatically sent to the electronic device to be tested to restart the electronic device to be tested, and then each memory test item is executed for a next memory configuration state. Repeating this sequence can automatically complete each memory module test item in various memory configurations.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A memory module test device, used to test miming performance of at least one memory module on an electronic device to be tested, wherein the electronic device to be tested comprises a circuit board, at least one memory module slot is disposed on the circuit board, and the memory module slot is used for the memory module to plug in, the memory module test device comprising:
  at least one adapter, comprising:
    a plugging portion, used to be plugged in the memory module slot;
    a slot, connected electrically to the plugging portion, used for the memory module to plug in, and capable of outputting a work voltage to the memory module when the adapter is plugged in the memory module slot and connected electrically to the memory module slot; and
    a switch circuit, connected electrically to the plugging portion and the slot; and
  a control unit, connected electrically to the switch circuit of the adapter, wherein the control unit enables or disables the plugged memory module by controlling the switch circuit.

2. The memory module test device according to claim 1, wherein the control unit is programmable.

3. The memory module test device according to claim 1, wherein the control unit comprises an operation interface, used to set a test operation procedure for the control unit.

4. The memory module test device according to claim 1, wherein the electronic device to be tested further comprises a storage device installed with a memory test program, and the memory test program executes at least one memory test item on the memory module.

5. The memory module test device according to claim 1, wherein the control unit controls the number and/or an order of tested memories of the memories by controlling the switch circuit.

6. The memory module test device according to claim 1, wherein the control unit controls enabling or disabling of each bit of the memory module by controlling the switch circuit.

7. The memory module test device according to claim 1, wherein the adapter further comprises a connection port, connected electrically to the switch circuit, and the control unit is connected electrically to the switch circuit through the connection port.

8. The memory module test device according to claim 1, wherein after a test in a memory configuration is completed, the control unit outputs a reset signal to the electronic device to be tested to restart the electronic device to be tested.

9. An adapter, used to adapt a memory module to a memory module slot of an electronic device to be tested, the adapter comprising:
- a plugging portion, used to be plugged in the memory module slot;
- a slot, connected electrically to the plugging portion, used for the memory module to plug in, and capable of outputting a work voltage to the memory module when the adapter is plugged in the memory module slot and connected electrically to the memory module slot; and
- a switch circuit, connected electrically to the plugging portion and the slot,
- wherein the switch circuit receives a first control signal to enable or disable the plugged memory module.

10. The adapter according to claim 9, further comprising a connection port, connected electrically to the switch circuit, and the switch circuit receives the first control signal through the connection port.

11. The adapter according to claim 9, wherein the switch circuit further receives a second control signal to control enabling or disabling of each bit of the memory module.

12. The adapter according to claim 11, wherein the first control signal and the second control signal are output by a control unit, and the control unit is connected electrically to a host and the switch circuit.

13. The adapter according to claim 9, wherein the switch circuit is selected from a transistor or a relay.

14. A memory module test method, used to test running performance of at least one memory module on an electronic device to be tested, wherein the electronic device to be tested comprises a circuit board, at least one memory module slot is disposed on the circuit board, and the memory module slot is used for the memory module to plug in, the memory module test method comprising:
- providing at least one adapter controlled by a control unit, wherein one end of the adapter is used to be plugged in the memory module slot, and the other end of the adapter is used for the memory module to plug in;
- plugging the one end of the adapter in the memory module slot;
- plugging the memory module in the other end of the adapter;
- controlling enabling and disabling of the memory module through the adapter by the control unit; and
- executing at least one memory test item on the memory module.

15. The memory module test method according to claim 14, wherein after executing each memory test item completely, the method further comprises:
- sending a reset signal to the electronic device to be tested to restart the electronic device to be tested.

16. The memory module test method according to claim 15, wherein the enabling and the disabling of the memory module define a first memory configuration state, and after sending the reset signal, the method further comprises:
- the adapter controlling enabling and disabling of the memory module to define a second memory configuration state; and
- executing each memory test item on the memory module in an enabling state in the second memory configuration state.

17. The memory module test method according to claim 14, wherein the adapter receives a first control signal sent by the control unit to control enabling or disabling of the memory module.

18. The memory module test method according to claim 14, wherein the adapter receives a second control signal sent by the control unit to control enabling or disabling of each bit of the memory module.

19. The memory module test method according to claim 14, wherein the adapter comprises:
- a plugging portion, used to be plugged in the memory slot;
- a slot, connected electrically to the plugging portion, used for the memory module to plug in, and capable of outputting a work voltage to the memory when the adapter is plugged in the memory module slot and connected electrically to the memory module slot; and
- a switch unit, connected electrically to the plugging portion and the slot, and capable of receiving a control signal sent by the control unit to control enabling and disabling of the memory module or enabling and disabling of each bit of the memory module.

* * * * *